United States Patent

Nozaki et al.

[11] 4,331,710
[45] May 25, 1982

[54] METHOD OF FORMING AN INSULATION FILM ON SEMICONDUCTOR DEVICE SURFACE

[75] Inventors: Takao Nozaki, Aizuwakamatsu; Takashi Ito, Kawasaki, both of Japan

[73] Assignee: Fujitsu Limited, Kanagawa, Japan

[21] Appl. No.: 212,083

[22] PCT Filed: Feb. 19, 1979

[86] PCT No.: PCT/JP79/00039
§ 371 Date: Sep. 8, 1980
§ 102(e) Date: Sep. 8, 1980

[87] PCT Pub. No.: WO80/01739
PCT Pub. Date: Aug. 21, 1980

[51] Int. Cl.³ .......................................... H01L 21/318
[52] U.S. Cl. ........................................................ 427/94
[58] Field of Search ........................................... 427/94

[56] References Cited

U.S. PATENT DOCUMENTS 3,520,722 7/1970 Scott ....................................... 427/94

OTHER PUBLICATIONS

Hackleman et al., J. of the Electrochemical Soc., vol. 125, No. 11, Nov. 1978, pp. 1875, 1876.
T. Ito et al., J. of the Electrochemical Soc., vol. 125, No. 3, Nov. 1978, pp. 448-452.

Primary Examiner—Ralph S. Kendall
Attorney, Agent, or Firm—Daniel Jay Tick

[57] ABSTRACT

In a method of forming an insulating film on the surface of a silicon substrate, a silicon nitride film is formed on such surface by direct thermal nitridation. The nitridation is initially in an ambient gas of nitrogen whereby a comparatively thick silicon nitride film is formed. The ambient gas is then changed to ammonia or a mixture of an inert gas and ammonia to densify the silicon nitride film. The resultant film is useful as an insulating film in semiconductor devices, masks for impurity diffusion and selective oxidation in the manufacture thereof.

1 Claim, 4 Drawing Figures

METHOD OF FORMING AN INSULATION FILM ON SEMICONDUCTOR DEVICE SURFACE

BACKGROUND OF THE INVENTION

The present invention relates to a method of forming an insulation film on the surface of a semiconductor device. More particularly, the invention relates to a method of forming a stable and dense insulation film on the surface of a semiconductor device, especially an integrated circuit, or IC.

In general, in order to minimize aging variation of the characteristics and improve reliability in manufacture of a semiconductor device, an area where the pn junction is exposed on the surface of said device is often covered with an insulating film. Furthermore, in a MISFET and MIS IC, a gate insulating film is provided in order to induce an inverting layer channel. Particular stability of the characteristics is therefore required. Usually, the semiconductor is silicon, the insulating film is silicon dioxide and the metal is aluminum.

However, the aforedescribed structure has the disadvantage that the gate threshold voltage varies greatly when an electrical field of about $10^6$ V/cm is applied to the insulating film at a temperature of 200° C. This phenomenon seems to occur as a result of variation of space charge distribution at the interface of the silicon and the insulating film due to the presence of trapping levels of the carrier caused by structural defects of $SiO_2$ and the drift of impurity ions migrating into the $SiO_2$. It is obvious that the effect of such variation of space charge due to structural defects at the interface of the Si and insulating film becomes most distinctive. For this reason, various coating techniques, such as vapor growth and sputtering etc., have been investigated instead of thermal oxide $SiO_2$ which easily permits the mingling of ions, such as the alkali ion. However, defects at the interface cannot be reduced more than those of the thermal oxide $SiO_2$.

On the other hand, thermal oxide $SiO_2$ produced in a very clean ambient is maintained at a defect of $10^{11}/cm^2$ in terms of the surface charge density. However, there is still a defect, such as excessive silicon ion etc., at the interface. This is a serious problem.

The principal object of the invention is to provide a method of forming an insulating film on the surface of a semiconductor device, which method overcomes the disadvantages of known methods.

An object of the invention is to provide a method of forming a high density silicon nitride film on the surface of a semiconductor substrate.

Another object of the invention is to provide a method of forming a homogeneous high density silicon nitride film on the surface of a silicon substrate.

Still another object of the invention is to provide a method of forming a comparatively thick, high density, homogeneous silicon nitride film on the surface of a silicon substrate.

BRIEF SUMMARY OF THE INVENTION

It is a known fact that nitriding proceeds when the Si substrate is heated in a nitrogen or ammonia ambient. However, it has been considered difficult to obtain homogeneous amorphous $Si_3N_4$. The inventors of this invention have discovered that a cause of this is that when a natural oxide film or impurity particle adheres to Si, the $Si_3N_4$ is crystallized due to substances considered as nuclei and grows, or local nitriding proceeds non-homogeneously. It has also been discovered that if the Si surface is clean, oxidation proceeds as well as nitriding, due to $O_2$ and $H_2O$ contained in the nitridation ambient. This results in the blocking of the growth of homogeneous $Si_3N_4$.

Therefore, the inventors of this invention previously proposed that the contents of $O_2$ and $H_2O$ in the nitrogen gas used for forming homogeneous and stable film should be kept at 1 ppm or less. The present invention is based on the knowledge that $Si_3N_4$ film which may be obtained by first directly nitriding a silicon substrate in a nitrogen gas ambient in a clean ambient and then directly nitrided in ammonia gas or a mixed ambient of inert gas and ammonia, is more minute in structure and the thickness of the film is easier to control than $Si_3N_4$ which may be obtained by directly nitriding the Si substrate in nitrogen gas only, ammonia gas only, or a mixed gas of ammonia as the reaction gas ambient. In other words, when direct nitriding is performed in an ambient of only nitrogen gas, $Si_3N_4$ film having a thickness of about 150 A may be formed within a period as short as 150 seconds.

In accordance with the invention, a method of forming a silicon nitride film on the surface of a silicon substrate comprises the steps of forming a silicon nitride film on the surface of a substrate by direct thermal nitridation in an ambient gas of nitrogen, and changing the ambient gas to a reaction gas of one of ammonia and a mixture of an inert gas and ammonia to further the direct thermal nitridation to densify the silicon nitride film.

BRIEF DESCRIPTION OF THE DRAWINGS

In order that the invention may be readily carried into effect, it will now be described with reference to the accompanying drawings, wherein.

DETAILED DESCRIPTION OF A PREFERRED EMBODIMENT OF THE INVENTION

Figure 1:
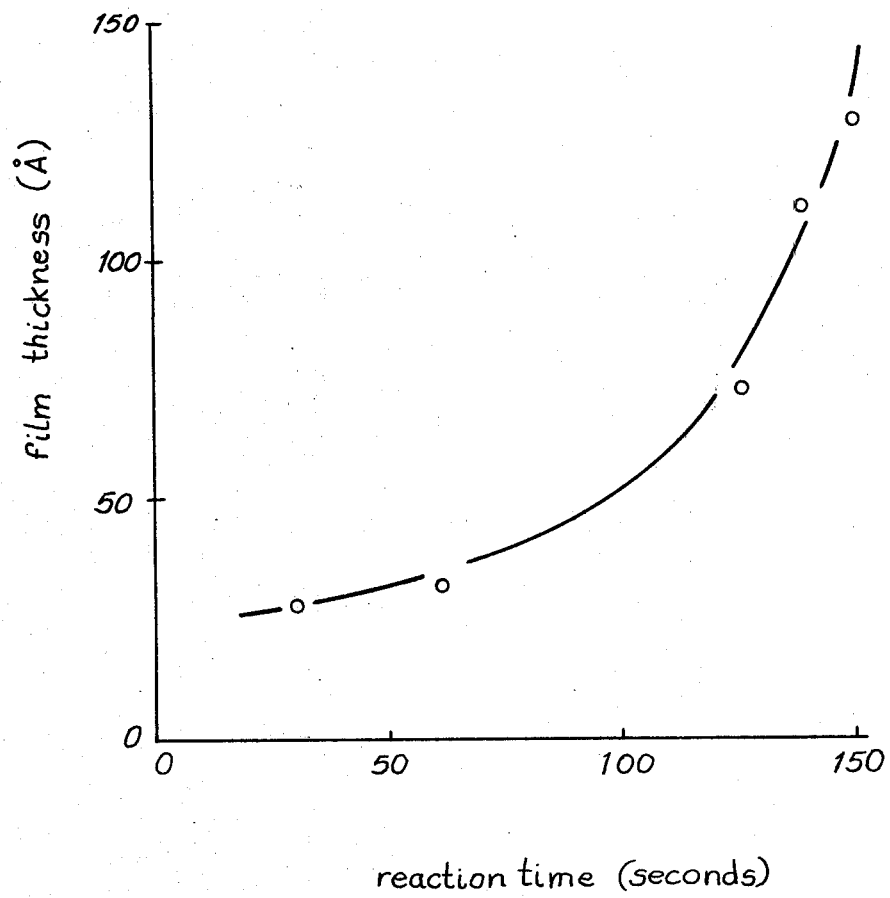
FIG. 1 is a graphical presentation showing the relation between the reaction time and the $Si_3N_4$ film thickness in a direct nitriding method using nitrogen gas.

As shown in FIG. 1, when direct nitriding is performed in an ambient of only nitrogen gas, $Si_3N_4$ film having a thickness of about 150 A may be formed within a period of 150 seconds.

In FIG. 1, the abscissa represents the reaction time in seconds and the ordinate represents the film thickness in A.

However, the refractive index of the $Si_3N_4$ film formed as hereinbefore explained is often as great as 2.3, instead of the refractive index 1.95 of ideal $Si_3N_4$. This means that silicon is contained in the $Si_3N_4$ film formed by direct nitriding in a nitrogen gas ambient.

Figure 2:
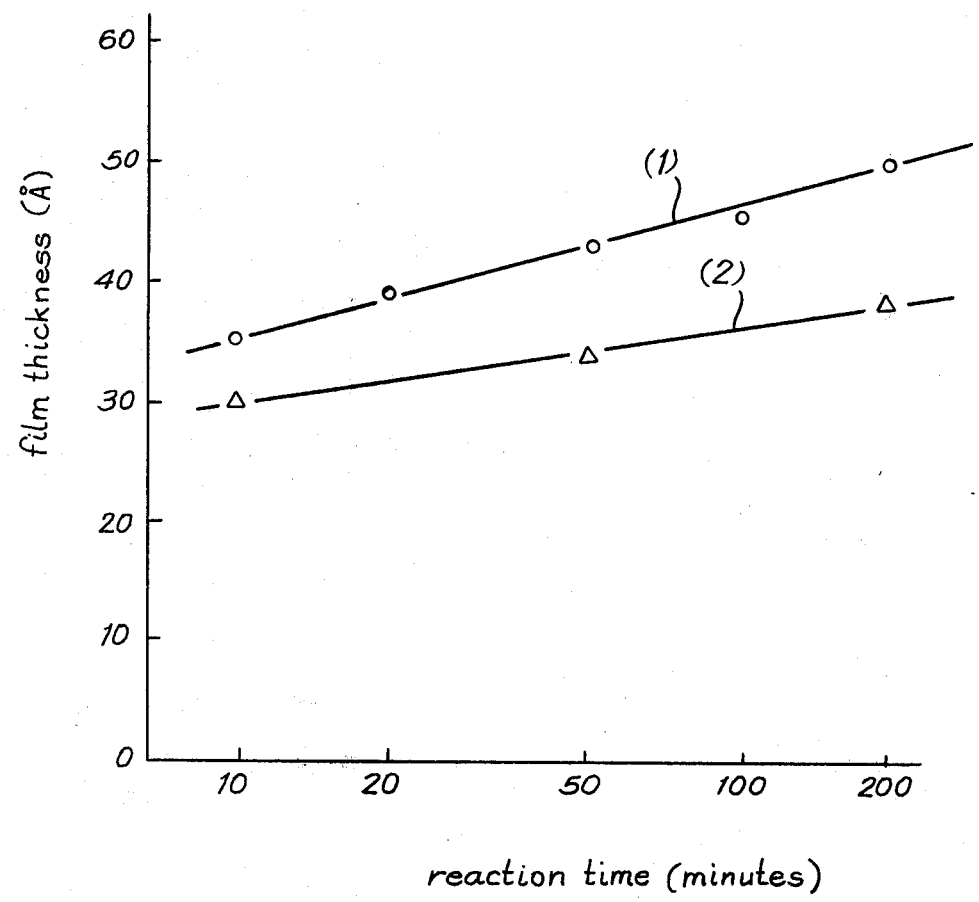
FIG. 2 is a graphical presentation showing the relation between the reaction time and the $Si_3N_4$ film thickness in a direct nitriding method using ammonia gas.
Figure 3:
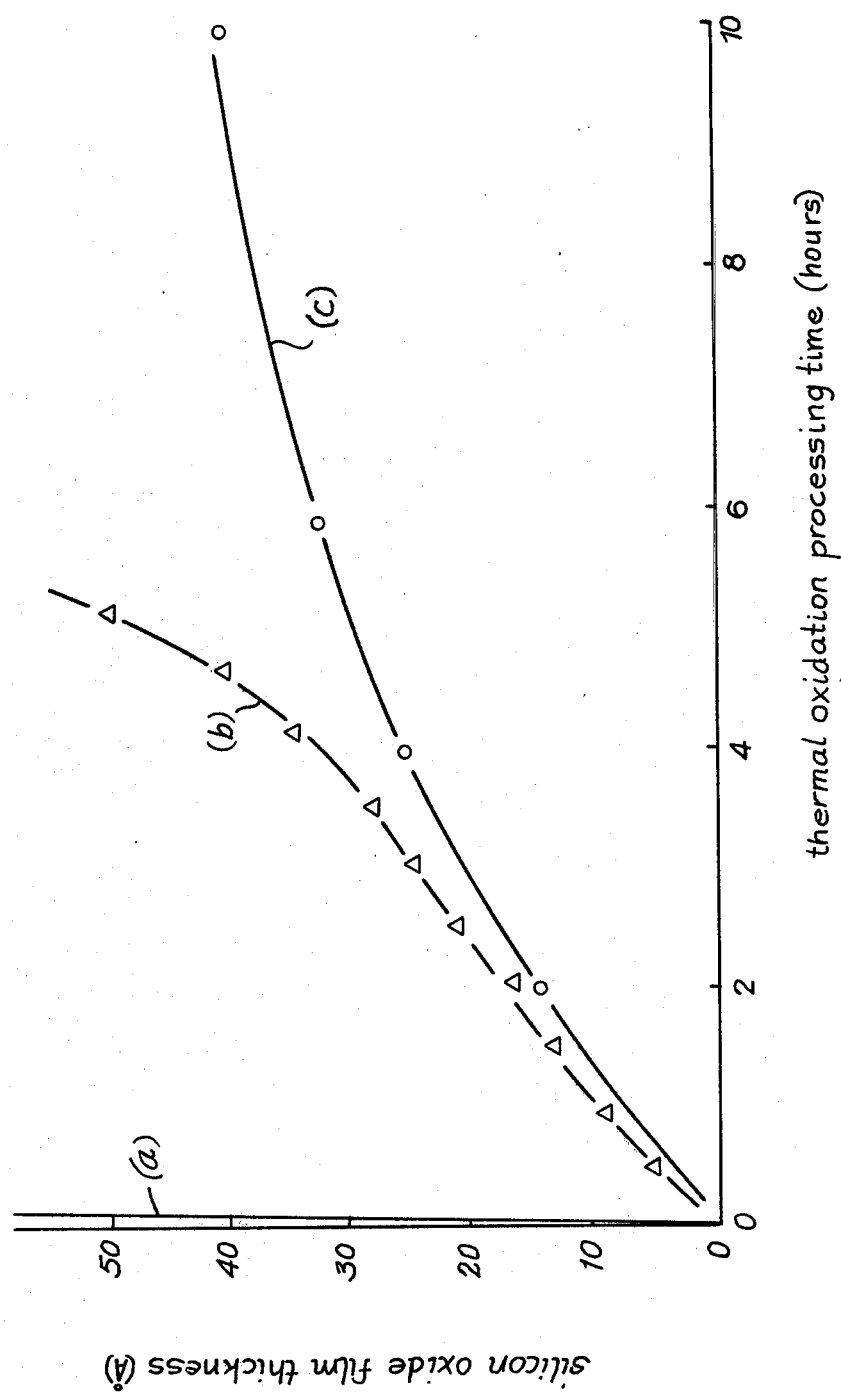
FIG. 3 is a graphical presentation showing the relation between the direct thermal oxidation processing time and the silicon oxide film thickness.

On the other hand, in a direct nitriding method using ammonia gas or a reaction gas consisting of a mixed gas including an inert gas and ammonia, the $Si_3N_4$ film may be as thin as 50 A, even if the reaction time is as long as 200 minutes, as shown in FIG. 2. In FIG. 2, which indicates the relation between the reaction time and the film thickness, the abscissa represents the reaction time in minutes and the ordinate represents the film thickness in A. In curve (1) of FIG. 2, the reaction temperature is 1300° C., and in curve (2) the reaction temperature is 1100° C. 100% ammonia is used as the ambient gas. FIG. 3 shows the relation between the oxidation time and the thickness of the silicon oxide film when the silicon substrate has an exposed surface indicated in curve (a), the silicon substrate has a silicon nitride film having a thickness of 75 A formed on the surface of the silicon substrate in a nitrogen gas ambient, indicated in curve (b) and the silicon substrate has a silicon nitride film with a thickness of 40 A formed in an ammonia gas ambient. In all these instances, the substrate is directly subject to thermal oxidation in dry oxygen gas at a temperature of 1010° C.

As is clear from FIG. 3, in the case of the silicon substrate (b), the growth rate of the silicon oxide is rapid and the masking ability for the oxygen is lost by the thermal oxidation process for about 5 hours. In the case of the silicon substrate (c), the growth rate of the silicon oxide film is slow and the masking ability for the oxygen is not lost even by the thermal oxidation, for as long as 10 hours. It may thus be said that silicon nitride film produced in an ammonia gas ambient is more dense than silicon nitride film produced in nitrogen gas. Furthermore, even when the silicon substrate is directly nitrided thermally in an ammonia gas ambient and then subject to thermal processing in a nitrogen gas ambient, an increase in the thickness of the silicon nitride film cannot be observed. It may therefore be concluded that the diffusion of nitrogen is rate-determined because of the dense structure of the silicon nitride produced in an ammonia gas ambient.

The method of the present invention of forming silicon nitride film is based on such characteristics that a thick $Si_3N_4$ film is produced in a direct nitriding method where nitrogen gas is used as the reaction gas and the formation of a thick silicon nitride is difficult, but a dense film may be produced in a direct nitriding method where ammonia gas or a mixed gas including an inert gas and ammonia is used as the reaction gas. In such method, silicon nitride film is produced by first using nitrogen gas and then ammonia gas or a mixed gas including an inert gas and ammonia as the reaction gas.

Figure 4:
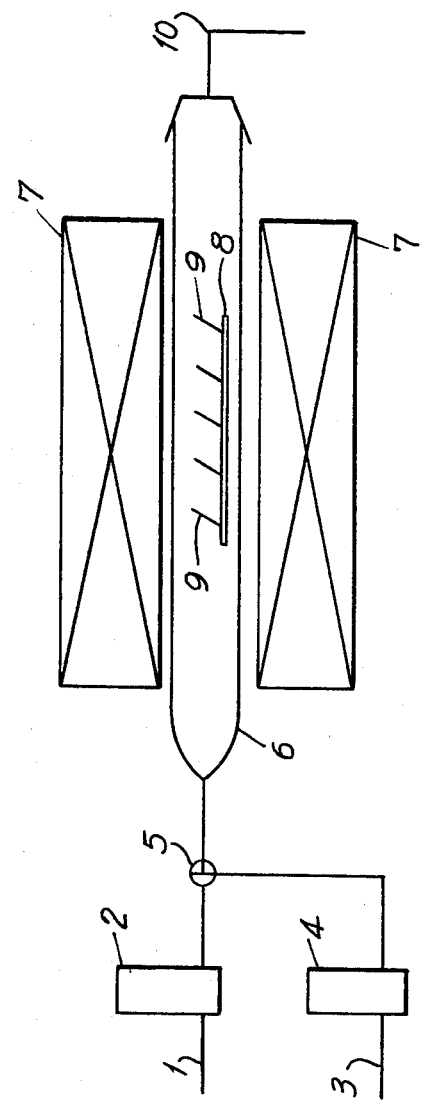
FIG. 4 is a block diagram of an embodiment of apparatus for executing the method of the invention.

FIG. 4 shows apparatus for carrying out the method of the invention. In FIG. 4, nitrogen gas 1 is supplied to a nitrogen gas refining system 2 using a catalyst. Ammonia gas 3 or a mixed gas of an inert gas and ammonia is supplied to an ammonia gas refining system 4 using a catalyst. The outputs of the refining systems 2 and 4 are fed through a changeover valve 5 to a reaction tube 6. The reaction tube 6 is heated by an electric furnace 7 and contains a silicon wafer holder 8 which supports silicon wafers 9. The reaction tube 6 has a gas exhaust port 10.

The surface of the silicon substrate 9 is sufficiently cleaned and said substrate is inserted into a uniformly heated area of the reaction tube 6. Nitrogen gas 1 flows in the reaction tube 6 at a rate of 5 liters per minute. Upon completion of nitriding of a constant amount of the nitrogen gas, nitriding is performed by changing the reaction gas from nitrogen to ammonia 3 or an inert gas and ammonia.

An object of the invention is to form a silicon nitride film substantially on a silicon substrate by nitriding silicon contained in the nitride film produced by nitrogen gas in an ammonia gas ambient or an ambient of an inert gas and ammonia gas. The silicon nitride film produced by the method of the invention is equivalent in thickness to the silicon nitride film obtained by nitriding of nitrogen gas. but is excellent in impurity diffusion masking ability and selective oxidation masking ability, because of its dense structure. This permits the manufacture of a semiconductor device having very stable electrical characteristics when the film is used as the gate insulating film of a MIS FET. As hereinbefore mentioned, the method of the invention insures a very great extensive effect.

While the invention has been described by means of a specific example and in a specific embodiment, we do not wish to be limited thereto, for obvious modifications will occur to those skilled in the art without departing from the spirit and scope of the invention.

We claim:

1. A method of forming a silicon nitride film on the surface of a silicon substrate, said method comprising the steps of forming a silicon nitride film on the surface of a substrate by direct thermal nitridation in an ambient gas of nitrogen; and changing the ambient gas to a reaction gas of one of ammonia and a mixture of an inert gas and ammonia to further the direct thermal nitridation to densify the silicon nitride film.

* * * * *